(12) United States Patent
Oh et al.

(10) Patent No.: US 6,408,653 B1
(45) Date of Patent: Jun. 25, 2002

(54) APPARATUS AND METHOD FOR MANUFACTURING OPTICAL FIBER PREFORM BY MCVD

(75) Inventors: Sung-koog Oh; Man-seok Seo; Mun-hyun Do; Jin-seong Yang, all of Gumi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/344,365

(22) Filed: Jun. 25, 1999

(30) Foreign Application Priority Data

Jun. 25, 1998 (KR) .............................. 98-24158

(51) Int. Cl.[7] .......................................... C03B 37/018
(52) U.S. Cl. ......................... 65/419; 65/428; 65/530
(58) Field of Search .......................... 65/414, 417, 419, 65/428, 530

(56) References Cited

U.S. PATENT DOCUMENTS

| 4,148,621 | A | * | 4/1979 | Gliemeroth | 65/417 |
| 4,331,462 | A | * | 5/1982 | Fleming, Jr. et al. | 65/391 |
| 4,528,009 | A | * | 7/1985 | Sarkar | 65/403 |
| 5,090,978 | A | * | 2/1992 | O'Brien, Jr. | 65/419 |
| 5,160,520 | A | * | 11/1992 | Keim et al. | 65/419 |
| 5,169,422 | A | * | 12/1992 | D'Annessa et al. | 65/419 |
| 6,145,345 | A | * | 11/2000 | Marszalek et al. | 65/414 |

FOREIGN PATENT DOCUMENTS

| EP | 0140113 A | 5/1985 |
| EP | 0357341 A | 3/1990 |
| EP | 490 059 A1 | * 12/1990 |
| EP | 480 453 A2 | * 4/1992 |
| EP | 0508677 A | 10/1992 |
| EP | 0965569 A | 12/1999 |
| EP | 0965569 A1 | 12/1999 |
| GB | 1574115 | 9/1980 |
| GB | 2138416 A | 10/1984 |
| JP | 52-009447 A | 1/1977 |
| JP | 53-133045 A | 11/1978 |
| JP | 56-014431 A | 2/1981 |
| JP | 57-067044 A | 4/1982 |
| JP | 58-156548 A | 9/1983 |
| JP | 60 122739 | 7/1985 |
| JP | 08-067524 A | 3/1996 |

* cited by examiner

*Primary Examiner*—Sean Vincent
(74) *Attorney, Agent, or Firm*—Robert E. Bushnell, Esq.

(57) ABSTRACT

An apparatus and a method for manufacturing an optical fiber preform by modified chemical vapor deposition (MDVD). The apparatus includes a heating device for heating a rotating substrate tube while moving in a predetermined direction, wherein the heating unit has a first heating unit located at the front with respect to the moving direction, for heating the substrate tube with a relatively low flame pressure, and a second heating unit located at the rear of the first heating means with respect to the moving direction, for heating the substrate tube with a relatively high flame pressure. The first and second heating units are selectively used for deposition and collapsing, such that the duration and temperature of collapsing can be reduced.

7 Claims, 4 Drawing Sheets

APPARATUS AND METHOD FOR MANUFACTURING OPTICAL FIBER PREFORM BY MCVD

CLAIM OF PRIORITY

This application makes reference to, incorporates the same herein, and claims all benefits accruing under 35 U.S.C. §119 from an application entitled Apparatus And Method For Manufacturing Optical Fiber Preform By MCVD earlier filed in the Korean Industrial Property Office on Jun. 25, 1998, and there duly assigned Serial No. 98-24158 by that Office.

BACKGROUND OF THE INVENTION

1. Field of the Invention

The present invention relates to the fields of methods and apparatus for manufacturing an optical fiber preform by modified chemical vapor deposition (MCVD), and more particularly, to the heating methods and apparatus used in MCVD.

2. Description of the Related Art

In the manufacture of an optical fiber preform by modified chemical vapor deposition (MCVD), as the thickness of a deposition layer of a preform increases, self-collapse of a tube occurs during the deposition, so that the thickness of the tube further increases. Thus, spread flame type burners (also known as propagation type flame burners) are typically used for general deposition processes due to their efficiency for heat transfer into a tube and for deposition therein. Due to the wide hot zone of the spread flame type burner, heat transfer into a tube is good and the deposition efficiency is high. Also a low flame pressure reduces unwanted shrinkage during the deposition. However, collapse and closure processes require a high flame pressure, unlike deposition processes. However, in the case where the spread flame type burner is used for the collapse and closure processes, due to low flame pressure, a high temperature of 2,100° C. or more for a collapse process and 2,200° C. for a closure process must be maintained at a low moving speed of the burner so as to soften a tube. As a result, the collapse and closure processes take up a large portion of the total processing time in manufacturing a preform, so that they are obstacles to shortening of the process time.

In a conventional method, in spite of the different mechanisms of the deposition and the collapse and the closure processes, all of these processes are performed using only a spread flame type burner suitable for deposition. Using the same spread flame type burner for the deposition, the collapse and the closure processes is adequate in the case of having a thin deposition layer and a is small tube. However, as the deposition layer becomes thick and the size of tube increases, the geometrical structure of the tube is deformed and the optical characteristics thereof are deteriorated, in addition to long process time being required.

SUMMARY OF THE INVENTION

It is therefore an object of the present invention to provide an improved apparatus and method for manufacturing a preform by modified chemical vapor deposition.

It is also an object of the present invention to provide an apparatus and method for manufacturing an optical fiber preform by modified chemical vapor deposition suitable for use with thick deposition layers and large substrate tubes.

It is a further object of the invention to provide an apparatus and method which allow for a shortened process time.

It is a yet further object of the invention to improve the geometry of the collapsed substrate tube.

It is a still further object of the invention to reduce the effects of polarization mode dispersion in the produced preform.

It is a still yet further object of the invention to reduce losses due to hydroxide diffusion in the produced preform.

To achieve the above objects, the present invention provides an apparatus for manufacturing a preform, adopting a concentrated flame type burner suitable for collapse and closure processes, in addition to a spread flame type burner suitable for a deposition process. The present invention also provides a method for manufacturing a preform using the apparatus adopting a concentrated flame type burner and a spread flame type burner.

Accordingly, there is provided an apparatus for manufacturing an optical fiber preform by modified chemical vapor deposition (MCVD), comprising heating means for heating a rotating substrate tube while moving in a predetermined direction, wherein the heating means comprises: first heating means located at the front with respect to the moving direction, for heating the substrate tube with a relatively low flame pressure; and second heating means located at the rear of the first heating means with respect to the moving direction, for heating the substrate tube with a relatively high flame pressure.

Preferably, the first and second heating means have a semi-cylindrical shape surrounding half of the tube circumference. Also, the apparatus for manufacturing an optical fiber preform further may comprise a reflector having a semi-cylindrical shape to enclose the other half of the tube circumference, the reflector facing the semi-cylindrical first and second heating means for reflecting heat produced by the first and second heating means toward the substrate tube.

Also to achieve the objects of the present invention, there is provided a method for manufacturing an optical fiber preform by modified chemical vapor deposition (MCVD), using an apparatus comprising a first heating means having a relatively low flame pressure and a second heating means having a relatively high flame pressure, the first and second heating means for heating a substrate tube while moving in a predetermined direction, the method comprising the steps of: (a) introducing a source gas together with oxygen into the substrate tube, and heating the substrate tube using the first heating means to deposit soot, to thereby deposit cladding and core layers; and (b) collapsing the substrate tube by heating the substrate tube in which the cladding and core layers have been deposited, using the second heating means.

Preferably, the collapsing step (b) comprises the sub-steps of: heating a region of the deposited substrate tube to be collapsed, using the first heating means, to thereby soften the region; and heating the softened region of the deposited substrate tube to perform collapsing.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
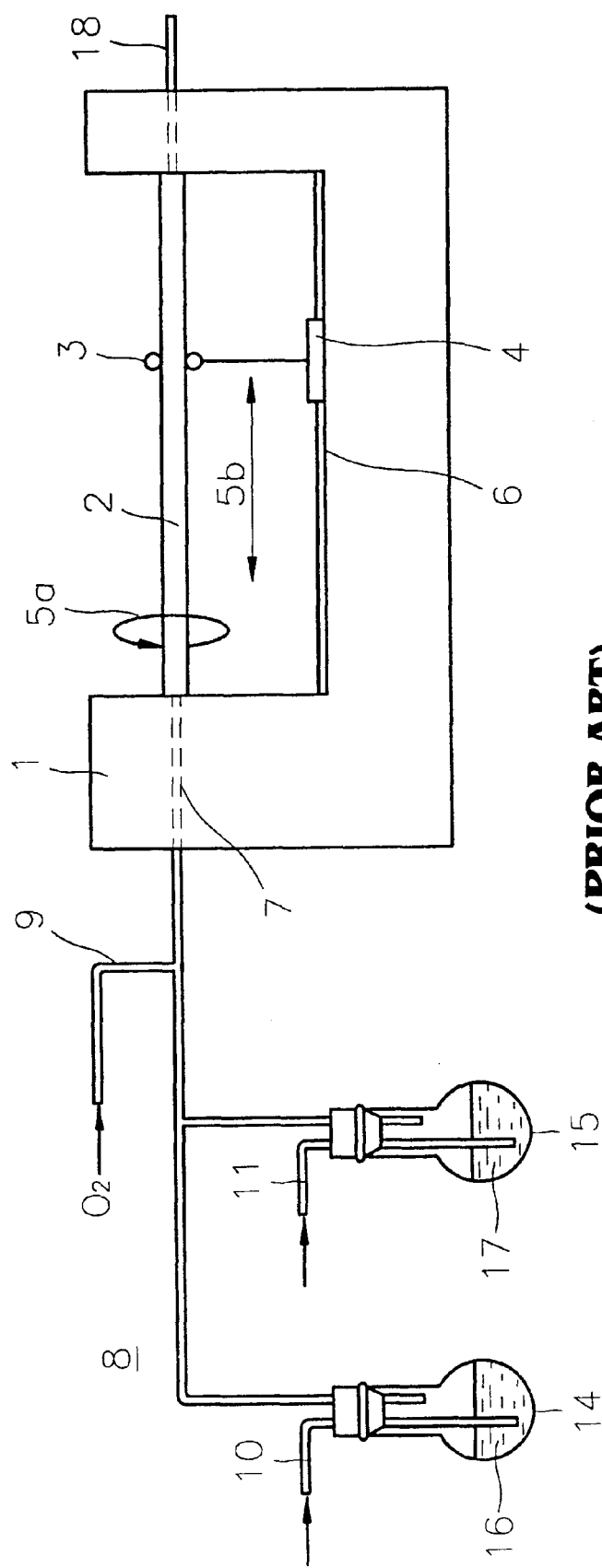
FIG. 1 is a diagram showing a general apparatus suitable for modified chemical vapor deposition (MCVD)

Turning now to the drawings, referring to FIG. 1, in a general apparatus suitable for a modified chemical vapor deposition (MCVD) process, a shelf 1 supports a substrate tube 2 and a heating means 4 heats a heating zone 3 of the substrate tube 2. The substrate tube 2 rotates, for example, in the direction indicated by an arrow 5a, and the heating means 4 reciprocates in the direction indicated by an arrow 5b by a moving member in track 6, so that the heating zone 3 is shifted along the entire substrate tube 2 while the substrate tube rotates. A source gas is introduced via a supply pipe 7 to the substrate tube 2, and the supply pipe 7 is connected to a source material storage portion 8. The source material storage portion 8 has an inlet 9 for oxygen. Storage tanks 14 and 15 contain reaction materials 16 and 17, which are usually liquids, and the reaction materials 16 and 17 enter the substrate tube 2, carried by carrier gases input via inlets 10 and 11. Also, the excited material is discharged via an outlet 18. A mixing valve (not shown) and a blocking valve (not shown) measure the flow of gases and perform other adjustments required for mixing.

Figure 2A:
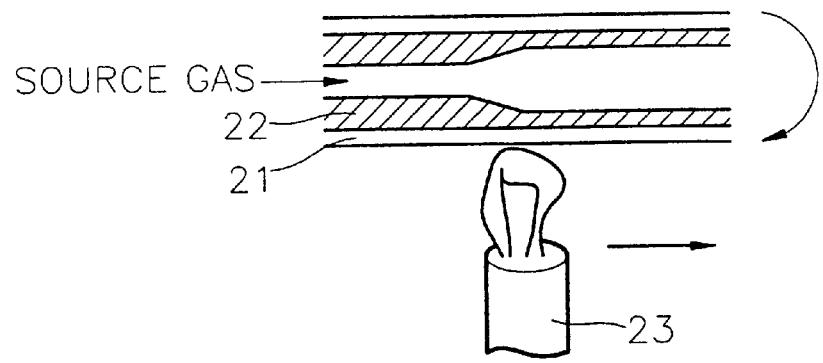
FIGS. 2A through 2C are diagrams illustrating a general MCVD method.
Figure 2B:
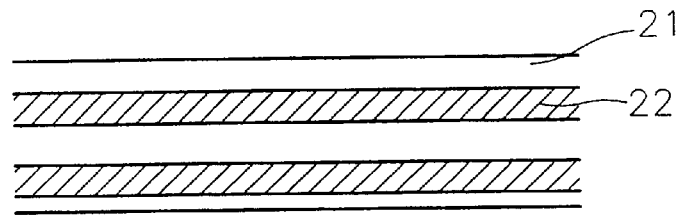
Figure 2C:
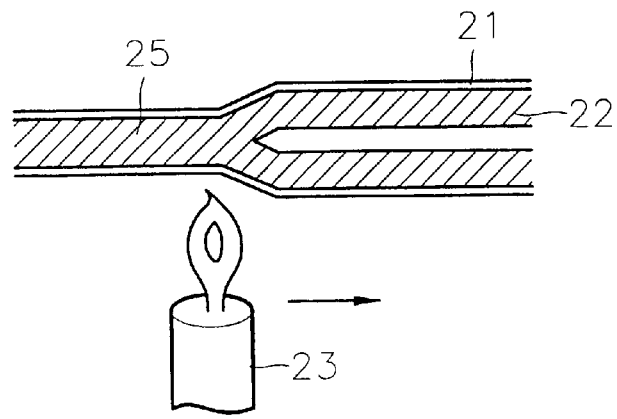

FIGS. 2A through 2C are diagrams illustrating a general MCVD process. In the MCVD process, a high-purity source gas such as $SiCl_4$, $GeCl_4$, $POCl_3$, $BCl_3$ or $CF_4$, is introduced together with oxygen into the substrate tube 21 made of glass, and the substrate tube 21 is heated by the heating means 23, resulting in soot, an oxidation deposit, on the inside of the substrate tube 21 formed by thermal oxidation (see FIG. 2A). Here, the concentration of the source gas is accurately adjusted under the control of a computerized system to control a refractive index, to thereby deposit a cladding and core layer 22 inside the substrate tube 21 (see FIG. 2B). Then, the substrate tube 21 on which the cladding and core layer 22 have been deposited is heated by the heating means 23, and collapsed to form an optical fiber preform 25.

Figure 3:
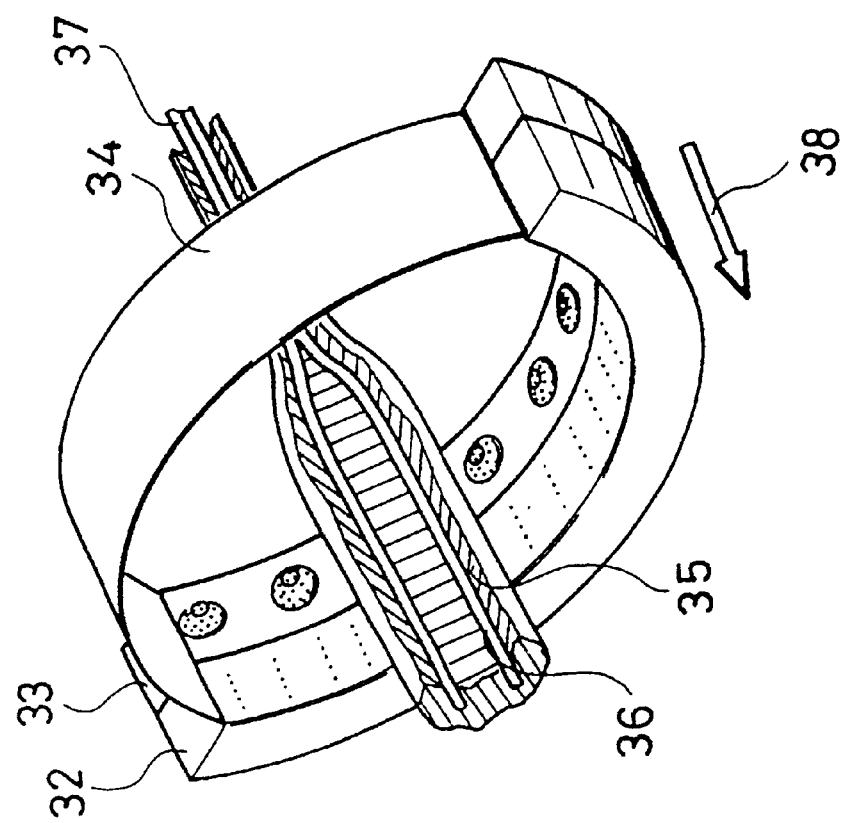
FIG. 3 shows the structure of heating means according to the present invention.

The present invention relates to an apparatus for manufacturing an optical fiber preform by MCVD, and more particularly, to an improvement in the heating means 4 shown in FIG. 1. Thus, the detailed structure of the heating means of the present invention is shown in FIG. 3. In FIG. 3, reference numeral 32 represents a spread flame type burner (spread flame burner 32), reference numeral 33 represents a concentrated flame type burner (concentrated flame burner 33), reference numeral 34 represents a reflector, reference numeral 35 represents a substrate tube, reference numeral 36 represents a deposited layer formed during the deposition, and reference numeral 37 represents an optical fiber preform formed during the collapse.

The heating means includes two burners, one suitable for deposition and the other suitable for the collapse process, that is, the spread flame type burner 32 and the concentrated flame type burner 33. Here, the spread flame type burner 32 is located in the front with respect to the moving direction indicated by arrow 38, and heats the substrate tube 35 with a spread flame type for the deposition, having a relatively low flame pressure. Meanwhile, the concentrated flame type burner 33 is located at the rear of the spread flame type burner 32 with respect to the moving direction indicated by the arrow 38, and heats the substrate tube 35 with a concentrated flame type for the collapse and closing processes, having a relatively high flame pressure. As shown in FIG. 3, the spread flame type burner 32 and the concentrated flame type burner 33 are located in order in the direction indicated by the arrow 38 and may have a semi-cylindrical shape partially surrounding the substrate tube 35. Here, the radius of the heating means having a semi-cylindrical shape is dependent on the size of tube and the location of flame focus.

Also, the heating means according to the present invention may further include a silica reflector 34. That is, the reflector 34 has a semi-cylindrical shape surrounding the remaining half of the substrate tube 35, which is not enclosed by the burners 32 and 33, and reflects the heat generated by the spread flame type burner 32 and the concentrated flame type burner 33 toward the substrate tube 35. By doing so, the gradient in temperature of the substrate tube 35 around the circumference thereof can be minimized. Also, the surface of reflector 34, facing the substrate tube 35, is preferably polished like a mirror, and the opposite surface thereof is made to be semitransparent.

Figure 4A:
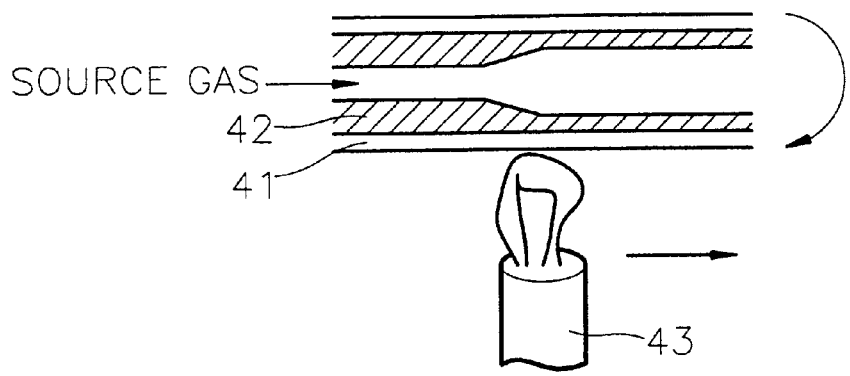
FIGS. 4A through 4C are diagrams illustrating a method for manufacturing an optical fiber by MCVD technology using the heating means shown in FIG. 3.
Figure 4B:
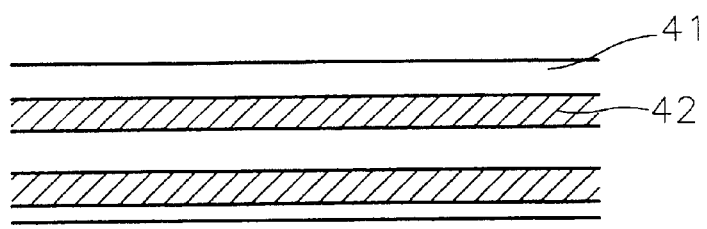
Figure 4C:
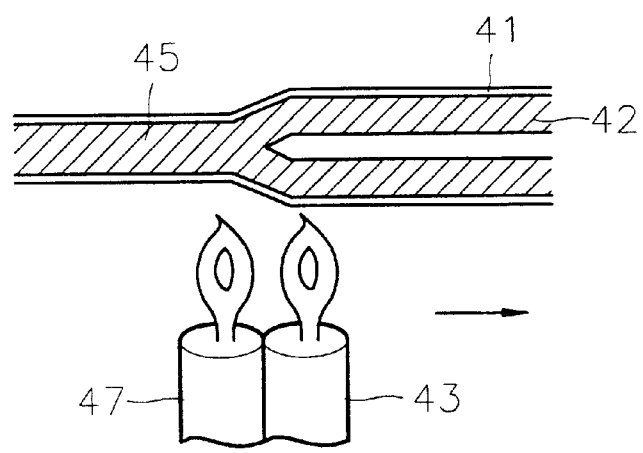

FIGS. 4A through 4C illustrate a method for manufacturing an optical fiber preform by MCVD using the heating means shown in FIG. 3. In this method, the two burners having different features are used separately or together with each other.

During deposition, as shown in FIG. 4A, a source gas is introduced into the substrate tube 41 together with oxygen, and the substrate tube 41 is heated by the spread flame type burner 43 having a relatively low flame pressure to cause thermal oxidation. Here, soot deposited inside the substrate tube 41 by thermal oxidation results in a cladding and core layer 42. FIG. 4B shows the cladding and core layer 42 deposited inside the substrate tube 41.

Then, during collapse (see FIG. 4C), the substrate tube 41 on which the cladding and core layer 42 have been deposited is heated by a concentrated flame type burner 47 having a relatively high flame pressure to collapse the substrate tube 41, resulting in an optical fiber preform 45. In the collapsing process, the part of the substrate tube 41 on which the cladding and core layer 42 has been deposited is to be softened by the spread flame type burner 43 that moves in the direction indicated by an arrow, prior to being collapsed by the concentrated flame type burner 47.

Thus, the process temperature can be reduced and the duration of the tube collapsing and closing becomes short by using the concentrated flame type burner 47 having a relatively high flame pressure in order to collapse the substrate tube 41 after softening the substrate tube 41 using the spread flame type burner 43. Also, using the reflector 34 improves uniformity in surface temperature around the entire circumference of the substrate tube 41. Accordingly, perfection in tube geometry can be enhanced, reducing the effects of polarization mode dispersion (PMD). Also, due to the lowered temperature for the collapsing process and the shortened duration of the collapsing process, loss due to OH-diffusion can be reduced.

The effects on the tube collapsing and closing process of a conventional burner which has a high flame temperature and moves at a slow rate, and of the twin burner according to the present invention, will now be compared and contrasted. First, as a small amount of moisture ($H_2$) (in general, about several parts per million (ppm)) contained in the substrate tube diffuses into a deposition layer during the tube collapsing and closing processes, the diffused moisture combines with $P_2O_5$ or $SiO_2$ in the cladding region of the deposition layer, to form P—O—H or Si—O—H bonds.

Also, hydroxy groups (—OH) diffusing to the core region of the deposition layer combine with $SiO_2$ or $GeO_2$, so that Si—O or Ge—O bonds are broken and Si—O—H or Ge—O—H bonds are formed. The O—H or P—O—H bonds formed by binding with moisture in each region of the deposition layer cause an additional increase in loss by an absorption band at a specific wavelength. In a single mode optical fiber, critical wavelengths undergoing loss are 1.24 and 1.385 $\mu$m for O—H bonds, and 1.2~1.8 $\mu$m for P—O—H bonds. Also, the OH diffused into the core region forms a non-bridging oxygen (NBO), so that homogeneity of the glass structure of the core region is locally deteriorated. Accordingly, density fluctuation occurs in the core region, thereby increasing scattering loss. However, in the method for manufacturing an optical fiber preform according to the present invention, the temperature and duration of the collapsing process can be reduced by using a concentrated flame type burner having a high flame pressure after softening the tube using a spread flame type burner, so that loss by the O—H bond can be markedly decreased, compared to the case of using only a spread flame type burner as in a conventional method.

Second, in the conventional tube collapsing and closing processes, a serious gradient in temperature usually results around the tube circumference when a burner heats the bottom of a rotating tube at a high temperature. Due to such a gradient in temperature, the viscosity of the substrate tube becomes irregular and the surface tension at the inside of the tube becomes unbalanced. As a result, the substrate tube is deformed, increasing tube ovalness. As collapse proceeds, the tube ovalness increases, and such an increase in tube ovalness increases PMD. However, in the method for manufacturing an optical fiber preform according to the present invention, heat produced by the burner can be reflected toward the tube using a reflector, so that the temperature along the entire tube circumference is substantially uniform, to thereby reduce the effect due to PMD.

As described above, in the apparatus for manufacturing an optical fiber preform by MCVD and the method thereof according to the present invention, a spread flame type burner and a concentrated flame type burner are selectively used to heat a substrate tube for the deposition and collapsing processes, and thus there is an advantage in that the duration and temperature of the collapsing process can be reduced.

What is claimed is:

1. A heating apparatus for manufacturing an optical fiber preform, comprising:
    a spread flame burner for heating a substrate tube by a low pressure flame for deposition of soot on the substrate tube and for softening the substrate tube prior to collapsing the substrate tube to form the optical fiber preform;
    a concentrated flame burner positioned adjacent to the spread flame burner for heating the substrate tube by a high pressure flame relative to the low pressure flame of the spread flame burner, for collapsing the substrate tube to form the optical fiber preform; and
    a reflector for reflecting heat from the spread flame burner and from the concentrated flame burner toward the substrate tube, a surface of the reflector facing the substrate tube including a mirror polish.

2. The apparatus of claim 1, further comprised of:
    a surface of the reflector facing away from the substrate tube being semitransparent.

3. A heating apparatus for manufacturing an optical fiber preform, comprising:
    a spread flame burner for heating a substrate tube by a low pressure flame for deposition of soot on the substrate tube and for softening the substrate tube prior to collapsing the substrate tube to form the optical fiber preform;
    a concentrated flame burner positioned adjacent to the spread flame burner for heating the substrate tube by a high pressure flame relative to the low pressure flame of the spread flame burner, for collapsing the substrate tube to form the optical fiber preform; and
    a reflector for reflecting heat from the spread flame burner and from the concentrated flame burner toward the substrate tube, a surface of the reflector facing away from the substrate tube being semitransparent.

4. A method for manufacturing an optical fiber preform, comprising the steps of:
    depositing at least one soot layer on a substrate tube by modified chemical vapor deposition;
    collapsing the substrate tube including each deposited soot layer by heating the substrate tube by applying a low pressure flame to soften the substrate tube and then applying a high pressure flame, relative to the low pressure flame, to the substrate tube softened by the low pressure flame to collapse the substrate tube to form the optical fiber preform by moving the low pressure flame and the high pressure flame along the substrate tube with the low pressure flame leading the high pressure flame; and
    reflecting heat from the high pressure flame and from the low pressure flame toward the substrate tube by a reflector, for uniformly heating a circumference of the substrate tube, with a surface of the reflector facing the substrate tube including a mirror polish.

5. The method of claim 4, further comprised of a surface of the reflector facing away from the substrate tube being semitransparent.

6. A method for manufacturing an optical fiber preform, comprising the steps of:
    depositing at least one soot layer on a substrate tube by modified chemical vapor deposition by heating the substrate tube using a low pressure flame from a spread flame burner positioned adjacent to a concentrated flame burner; and
    collapsing the substrate tube including each deposited soot layer by heating the substrate tube by applying a low pressure flame from the spread flame burner to soften the substrate tube and then heating the substrate tube softened by the low pressure flame by applying a high pressure flame from the concentrated flame burner, relative to the low pressure flame of the spread flame burner, to collapse the substrate tube to form the optical fiber preform by moving the low pressure flame and the high pressure flame along the substrate tube with the low pressure flame leading the high pressure flame; and
    reflecting heat from the spread flame burner and from the concentrated flame burner toward the substrate tube using a reflector mounted to the spread flame burner and to the concentrated flame burner, for uniformly heating a circumference of the substrate tube, the reflector including a mirror polish on a surface of the reflector facing the substrate tube.

7. The method of claim 6, further comprised of the reflector including a semitransparent surface on a surface of the reflector facing away from the substrate tube.

* * * * *